US012002349B2

(12) United States Patent
Duval et al.

(10) Patent No.: US 12,002,349 B2
(45) Date of Patent: Jun. 4, 2024

(54) MONITORING EQUIPMENT FOR CABLES

(71) Applicant: Alcatel Submarine Networks, Nozay (FR)

(72) Inventors: Mathieu Duval, Orsay (FR); Thierry Verhaege, Saulx-les-Chartreux (FR); Alain Cordier, Vaux-le-Penil (FR)

(73) Assignee: Alcatel Submarine Networks, Nozay (FR)

( * ) Notice: Subject to any disclaimer, the term of this patent is extended or adjusted under 35 U.S.C. 154(b) by 513 days.

(21) Appl. No.: 17/306,224

(22) Filed: May 3, 2021

(65) Prior Publication Data

US 2021/0343141 A1 Nov. 4, 2021

(30) Foreign Application Priority Data

May 4, 2020 (EP) .................................... 20305431

(51) Int. Cl.
*G08C 19/00* (2006.01)
*H03K 17/95* (2006.01)
(Continued)

(52) U.S. Cl.
CPC ........... *G08C 19/00* (2013.01); *H03K 17/952* (2013.01); *H04B 3/02* (2013.01); *H04B 3/26* (2013.01); *H01L 2225/06531* (2013.01)

(58) Field of Classification Search
CPC ........ G08C 19/00; H03K 17/952; H04B 3/02; H04B 3/26; H04B 3/58; H01L 2225/06531; G01V 1/201; G01V 1/008
See application file for complete search history.

(56) References Cited

U.S. PATENT DOCUMENTS 4,481,611 A * 11/1984 Burrage ............... G01V 1/3835
367/19
4,912,684 A 3/1990 Fowler
(Continued)

FOREIGN PATENT DOCUMENTS

CN 101730977 A * 6/2010 ............ G01V 3/083
CN 104254300 B * 5/2017 ........... A61B 5/0031
(Continued)

OTHER PUBLICATIONS

Translation of CN-104254300 (Year: 2017).*
(Continued)

*Primary Examiner* — Daniel Pihulic
(74) *Attorney, Agent, or Firm* — Mendelsohn Dunleavy, P.C.; Steve Mendelsohn

(57) ABSTRACT

In certain embodiments, an assembly has intermediate pods magnetically, but not galvanically, coupled along an electrically conductive cable. Each pod has a magnetic core surrounding and inductively coupled to the cable and one or more coils inductively coupled to the magnetic core. The pod transmits, for example, outgoing current pulses on the cable by inducing electrical signals in the cable using a transmitter coil and the magnetic core. In addition, the pod repeats, for example, incoming current pulses on the cable by inducing electrical signals in the cable using the transmitter coil and the magnetic core, based on electrical signals induced in a receiver coil via the magnetic core by the incoming current pulses. Such an assembly can function as a data collection system for scientific research and/or as an early-warning system for events, such as earthquakes and tsunamis, without having to modify the cable itself.

17 Claims, 2 Drawing Sheets

(51) Int. Cl.
*H04B 3/02* (2006.01)
*H04B 3/26* (2006.01)

(56) References Cited

U.S. PATENT DOCUMENTS

| | | | |
|---|---|---|---|
| 6,091,670 A | | 7/2000 | Oliver et al. |
| 2007/0145830 A1 | | 6/2007 | Lee et al. |
| 2011/0118888 A1 | | 5/2011 | White, II |
| 2013/0300208 A1 | | 11/2013 | Yu et al. |
| 2014/0063493 A1 | | 3/2014 | Nash et al. |
| 2021/0343141 A1 | * | 11/2021 | Duval ............... H04B 3/26 |

FOREIGN PATENT DOCUMENTS

| | | | | | |
|---|---|---|---|---|---|
| EP | 3907535 A1 | * | 11/2021 | ............ | G01V 1/008 |
| JP | H04-177923 A | | 6/1992 | | |
| JP | 2021177175 A | * | 11/2021 | ............ | G01V 1/008 |
| JP | 7254853 B2 | * | 4/2023 | ............ | G01V 1/008 |
| WO | 2019014721 A1 | | 1/2019 | | |

OTHER PUBLICATIONS

Communication pursuant to Article 94(3) EPC for corresponding European application No. 20305431.7; dated Jan. 31, 2023 (8 pages).
Extended European Search Report for corresponding European application No. 20305431.7; dated Oct. 28, 2020 (8 pages).
Howe, Bruce M., et al. "SMART Cables for Observing the Global Ocean: Science and Implementation." Frontiers in Marine Science, vol. 6, Article 424 (2019): 27 pages.
Communication pursuant to Article 94(3) EPC for corresponding European application No. 20305431.7; dated May 10, 2022 (6 pages).
Notice of Reasons for Refusal for corresponding Japanese application No. 2021-077004; dated Aug. 2, 2022 (8 pages) Machine Translation.
Summons to attend oral proceedings pursuant to Rule 115(1) EPC for corresponding European application No. 20305431.7; dated Oct. 12, 2023 (15 pages).

* cited by examiner

MONITORING EQUIPMENT FOR CABLES

CROSS-REFERENCE TO RELATED APPLICATIONS

This application claims the benefit of the filing date of EP application no. 20305431.7, filed on 4 May 2020, the teachings of which are incorporated herein by reference.

BACKGROUND

Field of the Invention

Various example embodiments relate to techniques for monitoring ambient conditions along cables such as submarine cables in order to generate sensor data, e.g., for scientific research and/or to detect events, such as, e.g., earthquakes and tsunamis.

Description of the Related Art

This section introduces aspects that may help facilitate a better understanding of the invention. Accordingly, the statements of this section are to be read in this light and are not to be understood as admissions about what is prior art or what is not prior art.

Some submarine power-transmission cables and submarine fiber-optic communication cables may be configured with accelerometers and pressures sensors to detect vibrations and pressure changes characteristic of earthquakes, tsunamis, and other catastrophic events to provide an early-warning system for such events. For example, some submarine fiber-optic communication cables may have spans of optical fibers interconnected by repeaters that amplify the optical signals for transmission from one end of the cable to the other. Such cables typically also have spans of electrically conductive (e.g., metal) wiring that provide electrical power to and electronic signaling to and from the repeaters.

The proposed SMART (Scientific Monitoring And Reliable Telecommunications) technology would involve the provisioning of sensors, such as accelerometers, pressure sensors, and temperature sensors, as an integral part of a submarine fiber-optic communication system for recording scientific measurements that can be used, for example, to detect events such as earthquakes and tsunamis. Such sensors may be implemented as part of the cable repeaters or within the cable itself along the cable spans between repeaters or both. Reliable implementations of SMART technology would be technically complex and expensive.

SUMMARY

Certain embodiments of the present disclosure are electrical components, referred to herein as "pods," that are configured around the outside of a (e.g., submarine) cable at different locations along the length of the cable. The pods are configured to repeat (i.e., re-transmit) electrical signals received from other pods. In some embodiments, the pods are also configured to monitor ambient conditions along the cable and transmit, via the cable, electrical signals representing data characterizing those ambient conditions. In this way, by provisioning a cable with a number of pods distributed along its length, the resulting cable-with-pods assembly can be used, for example, to generate sensor data for scientific research and/or as an early-warning system for events, such as earthquakes and tsunamis.

According to an example embodiment disclosed below in reference to FIGS. 1-2, provided is an apparatus comprising a pod. The pod comprises a magnetic core configurable around and inductively couplable to a cable having an electrically conductive portion, one or more coils inductively couplable to the magnetic core, and a controller connected to the one or more coils. The pod is configured to transmit one or more outgoing electrical signals on the conductive portion of the cable by the controller electrically energizing a transmitter coil of the one or more coils such that outgoing magnetic energy is induced in the magnetic core such that the one or more outgoing electrical signals are induced in the conductive portion of the cable. The pod is also configured to repeat one or more incoming electrical signals on the conductive portion of the cable by the one or more incoming electrical signals inducing incoming magnetic energy in the magnetic core such that incoming electrical energy is induced in a receiver coil of the one or more coils, wherein the controller responds to the incoming electrical energy by electrically energizing the transmitter coil such that outgoing magnetic energy is induced in the magnetic core such that the one or more incoming electrical signals are inductively repeated in the conductive portion of the cable.

In some embodiments of the above apparatus, when the magnetic core is configured around and inductively coupled to the cable, the magnetic core is not galvanically connected to the electrically conductive portion of the cable.

In some embodiments of any of the above apparatuses, the transmitter coil and the receiver coil are either the same coil or two different coils.

In some embodiments of any of the above apparatuses, the pod further comprises one or more passive detectors configured to detect an event, and the pod is configured to transmit the one or more outgoing electrical signals on the conductive portion of the cable in response to the detection of the event by the one or more passive detectors.

In some embodiments of any of the above apparatuses, the controller is configured to selectively operate in one of at least a sleep mode and an awake mode, and the controller is configured to automatically transition from the sleep mode to the awake mode in response to the detection of the event by the one or more passive detectors.

In some embodiments of any of the above apparatuses, the pod is configured to transmit a wake-up signal followed, after a specified time delay, by a set of data signals in response to the detection of the event by the one or more passive detectors.

In some embodiments of any of the above apparatuses, the pod further comprises one or more active sensors configured to generate measurement signals, and the pod is configured to transmit the one or more outgoing electrical signals on the conductive portion of the cable in response to the generation of the measurement signals by the one or more active sensors.

In some embodiments of any of the above apparatuses, the pod further comprises a clock generator, the controller is configured to selectively operate in one of at least a sleep mode and an awake mode, and the controller is configured to automatically transition from the sleep mode to the awake mode based on a clock signal from the clock generator.

In some embodiments of any of the above apparatuses, the pod is configured to transmit a wake-up signal followed, after a specified time delay, by a set of data signals corresponding to the measurement signals generated by the one or more active sensors.

In some embodiments of any of the above apparatuses, the controller is configured to selectively operate in one of at least a sleep mode and an awake mode, and the controller is configured to transition from the sleep mode to the awake mode upon arrival at the pod of a wake-up signal in the cable.

In some embodiments of any of the above apparatuses, the pod is configured to repeat the wake-up signal.

In some embodiments of any of the above apparatuses, after receiving the wake-up signal, the pod is configured to repeat one or more received data signals in the cable such that each repeated data signal in the cable overlaps in time with the corresponding received data signal in the cable.

According to an example embodiment disclosed below in reference to FIGS. 1-2, provided is a system comprising a plurality of apparatuses as described herein, the cable, and at least one terminal pod located at at least one end of the cable, wherein a plurality of pods are configured around and inductively coupled to the cable at separate intermediate locations along the length of the cable.

In some embodiments of the above system, a plurality of any of the above apparatuses are configured around and inductively coupled to the cable at separate intermediate locations along the length of the cable, and at least one terminal pod located at at least one end of the cable.

In some embodiments of the above system, a pod coupled at an intermediate location along the length of the cable is configured to transmit a wake-up signal followed, after a specified time delay, by a set of data signals, and the specified time delay is long enough to ensure that one or more other pods from the plurality of pods are woken up by an instance of the wake-up signal and are able to respectively repeat the set of data signals.

In some embodiments of any of the above systems, each pod from the plurality of pods is configured to repeat signals received from at least two pods on at least one side.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Detailed illustrative example embodiments of the present invention are disclosed herein. However, specific structural and functional details disclosed herein are merely representative for purposes of describing example embodiments of the present invention.

The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
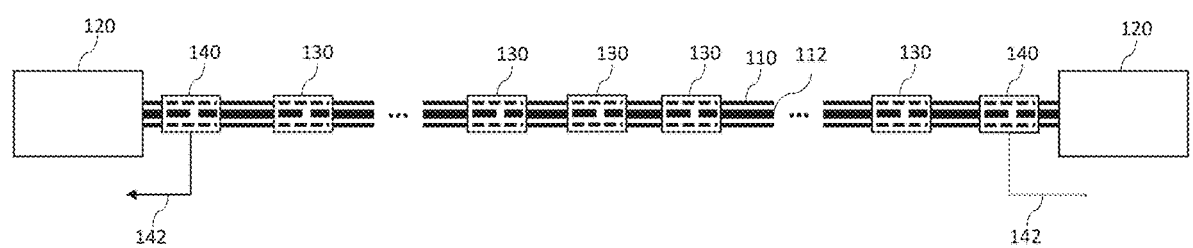
FIG. 1 is an example of a simplified representation of a cable-with-pods assembly according to certain embodiments of the disclosure.

FIG. 1 is an example of a simplified representation of a cable-with-pods assembly 100 according to certain embodiments of the disclosure. Although the techniques of the present disclosure can be implemented in the context of any system having a cable with an electrically conductive core, these techniques are first described with respect to the cable-with-pods assembly 100 of FIG. 1 for a cable-based power-transmission system. Those skilled in the art will understand how to implement the invention in the context of other cable-based systems, such as (without limitation) cable-based communication systems having fiber-optic cables.

As shown in FIG. 1, the cable-with-pods assembly 100 has a power-transmission cable 100 supplied by two PFE (power feed equipment) modules 120 that support the transmission of electrical power from either end of the cable to the other over a contiguous, electrically conductive (e.g., copper, aluminum, or other suitable material) core 112 that spans the length of the cable 110. Some alternative power-transmission systems may have only one PFE module and therefore transmit power in only one direction. Note that, in some other embodiments, a cable-with-pods assembly might have no PFE modules.

The assembly 100 also includes a set of pods 130/140 distributed along the length of the cable 110. In particular, the assembly 100 has (i) two terminal pods 140 located at (or proximate to) either end of the cable 110 near the PFE modules 120 and (ii) a number of intermediate pods 130, e.g., evenly, distributed along the length of the cable 110 between the two terminal pods 140. In one possible submarine application, the two PFE modules 120 and the two terminal pods 140 (along with the two corresponding portions of the cable 110) are terrestrial (i.e., located on land), while the intermediate pods 130 (along with the rest of the cable 110) are submarine (i.e., located under water).

As explained further below, each pod 130/140 has two shaped portions (not explicitly represented in FIG. 1) that enable the pod to be configured (e.g., clamped) around the cable 110 without having to modify the cable itself, where the contiguous cable 110 passes through an (e.g., cylindrical) opening formed by each assembled pod (as depicted by the broken lines in FIG. 1). Those skilled in the art will understand that a pod could have more than two portions and/or the portions could have any suitable shapes that enable the portions to be configured to form an assembled pod surrounding the cable 110. Alternatively, each pod could have a unitary structure with an opening that enables the pod to be slid over an end of the cable and secured at its desired location using some suitable mechanism.

The pods 130/140 are inductively, but not galvanically, coupled to the cable's conductive core 112. In particular, each intermediate pod 130 has circuitry (not shown in FIG. 1) that enables the pod to magnetically induce electrical signals, e.g., in some implementations, pulses of electrical current, that propagate in both directions along the conductive core 112 away from the pod. In addition, current pulses induced in the cable's conductive core 112 by another pod and arriving at an intermediate pod 130 will magnetically induce electric signals within that intermediate pod that cause the intermediate pod to induce repeated current pulses in the conductive core 112. Similarly, current pulses arriving at a terminal pod 140 will magnetically induce electrical signals within that terminal pod that cause the pod to transmit, to the external world, data signals 142 corresponding to those current pulses. Note that, although implementations are described below in terms of current pulses, in other implementations, electrical signals other than current pulses, such as (without limitation) low-frequency voltage signals or current waves, could be employed.

Note that, for applications in which the cable independently carries a current, such as in the power-transmission application of FIG. 1, the current pulses induced by the pods appear as relatively minor perturbations on the steady-state electrical current corresponding to the power being transmitted through the cable 110. As such, the pods 130/140 can operate without adversely affecting the power-transmission function of the cable 110. Similarly, when the cable is a fiber-optic communication cable, the induced current pulses from the pods appear as relatively minor perturbations on the electrical currents transmitted along the conductive portion of the communication cable. Furthermore, those induced current pulses do not interfere with the optical signals transmitted along the cable's optical fibers. As such, the pods 130/140 can also be used in a cable-with-pods assembly where the cable is a fiber-optic communication cable without adversely affecting the communication function of the cable. Note that, in some other embodiments, the conductive portion of the cable does not carry any independent current.

In certain implementations of the cable-with-pods assembly 100 of FIG. 1, each intermediate pod 130 is powered by a local battery (not shown in FIG. 1), such as (without limitation) a LiSOCl$_2$ bobbin-type battery. In order to preserve battery life, each intermediate pod 130 may be maintained in a sleep mode during which most of the pod's electrical components are powered down, with at least one exception being the pod's local clock generator (not shown in FIG. 1), which runs continuously. Note that, since the terminal pods 140 are terrestrial, they can be externally powered and therefore can remain powered on (i.e., in awake mode) continuously. In other implementations, in addition to or instead of being battery-powered, the intermediate pods 130 may be able to be externally powered, either from the cable 110 itself or from some other suitable external power supply, such as, e.g., an energy harvester harvesting energy from seabed movements.

In some implementations, each intermediate pod 130 includes one of more unpowered (i.e., passive) detectors that, upon detection of an event, such as an earthquake or a tsunami, will cause the pod to transition from its sleep mode to its awake mode, during which most if not all of the pod's electrical components are powered on. For example, the one or more passive detectors may include (without limitation) an accelerometer configured to detect an acceleration indicative of an earthquake, a pressure switch configured to detect a pressure change indicative of a tsunami, and/or an acoustic sensor configured to detect acoustic signals indicative of any suitable sound-producing event such as movement near the cable. The intermediate pod 130 will then magnetically induce a corresponding sequence of current pulses in the cable's conductive core 112 that will be repeated by other pods until the current pulses reach the terminal pods 140. In this way, each intermediate pod 130 can independently function as an event detector, and the cable-with-pods assembly 100 can function as an early-warning system for earthquakes, tsunamis, and other catastrophic events.

In some implementations, in addition to or instead of the one or more passive detectors, each intermediate pod 130 includes one or more powered (i.e., active) sensors, such as accelerometers, pressure sensors, temperature sensors, salinity sensors, pH sensors, etc., that generate measurements of ambient conditions when the pod is in its awake mode. In these implementations, during the awake mode, the pod will magnetically induce a sequence of current pulses in the cable's conductive core 112 that represent measurement signals generated by the one or more active sensors, which current pulses are repeated by other pods until the current pulses reach the terminal pods 140. In this way, each intermediate pod 130 can independently monitor its local ambient conditions, and the cable-with-pods assembly 100 can function as a science monitoring system for ambient conditions across the span of the cable 110.

Depending on the implementation, an intermediate pod 130 will automatically transition from its sleep mode to its awake mode in one or more of the following ways: (i) upon detection of an event by a passive detector in the pod, (ii) upon arrival of a sequence of pulses from another pod, and (iii) periodically based on a clock signal generated by the pod's local clock generator.

In certain implementations, each sequence of current pulses initiated by an intermediate pod 130 comprises an initial "wake-up" pulse followed, after a specified time delay, by a set of data pulses that encode binary data representing such information as a unique ID number for the initiating pod, the type(s) of passive detector(s) that detected an event, measurement signals generated by one or more active sensors, and/or a time stamp based on the pod's clock generator. In some implementations, a binary value "1" is represented by a pulse, while the binary value "0" is represented by the absence of a pulse, where the pulses are transmitted based on a specified clock rate that implies a specified minimum separation time between consecutive pulses. Note that the binary data may include forward error codes or correction codes to improve the reliability of the data transmission.

In one possible implementation, the specified time delay between the wake-up pulse and the start of the set of data pulses is selected to be sufficiently long to ensure that (i) each other intermediate pod 130 along the cable 110 will be able to repeat the data pulses, when they arrive at that intermediate pod and (ii) each terminal pod 140 will be able to convert those data pulses into the corresponding data signal 142. The specified time delay is preferably selected based on the worst-case scenario in which the event-detecting pod is either the first or last intermediate pod 130 along the cable 110 such that the terminal pod 140 at the other end of the cable 110 is ensured to be able to process the data pulses by the time those data pulses arrive at that terminal pod.

Whenever an intermediate pod 130 receives a wake-up pulse from another pod, the receiving pod will transition from its sleep mode to its awake mode, repeat the wake-up pulse, and then repeat the set of data pulses when they arrive. As explained further below, in preferred implementations, each intermediate pod 130 is capable of repeating each received data pulse sufficiently fast such that the repeated data pulse substantially coincides in time with the received data pulse. In this way, each intermediate pod 130 operates to effectively amplify the attenuated data pulses as they propagate along the cable 110. Note that a repeated wake-up pulse does not have to substantially coincide with the corresponding received wake-up pulse as they propagate along the cable in the same direction.

In order to ensure that the wake-up and data pulses can be reliably repeated, the intermediate pods 130 should be spaced sufficiently closely along the cable 110 so that pulses from at least one adjacent pod on either side of an intermediate pod are not too attenuated to be processed when they arrive. Note that, in some implementations, in order for the cable-with-pods assembly 100 to be able to continue to function in the event of a single-pod failure, the intermediate pods 130 should be spaced closely enough such that each pod is able to repeat pulses received from at least two pods on each side of the pod (for pods having at least two pods on both sides). On the other hand, in order to avoid undesirable echo, the pods should be spaced far enough apart so that the pulses that each pod receives from other, further-away pods are sufficiently attenuated such that those pulses will be too weak to be repeated by the pod.

Since each pulse propagates along the cable 110 in both directions, in order to avoid undesirable "echo," in some implementations, when a pod is initiating the transmission of a sequence of pulses, the pod is configured in a "transmit only" mode in which it will not repeat any received pulses until after it has completed the transmission of its sequence of pulses. After a specified time-out period following the last transmitted data pulse, the initiating pod will automatically transition back into its sleep mode or be ready to repeat pulses.

Furthermore, after repeating a received pulse, each other pod will ignore any received pulses for the specified minimum separation time between data pulses. For example, if the specified minimum separation time between data pulses is 10 msec, and if it takes about 1 msec for a data pulse to travel from one pod to the next, then, after a pod repeats a pulse, the pod will ignore any received pulses for the next 10 msec. In that way, each pod will repeat each set of data pulses only once. After a specified time-out period following the last repeated data pulse, each repeating pod will transition back into its sleep mode.

Since the vibrations and pressure changes associated with an event may be independently detectable at two or more different intermediate pods 130, in order to avoid multiple, overlapping sequences of pulses corresponding to the same event, whenever an intermediate pod 130 is in its awake mode as a result of receiving a wake-up pulse, that pod will disable its own event-detection processing. In this way, the intermediate pod 130 that is "closest" to the event will initially be the only event-detecting pod. In some implementations, after an intermediate pod 130 is an event-detecting pod, it starts an internal timer that prevents the pod from again becoming an event-detecting pod for the duration of the timer. In this way, other intermediate pods 130 that are "farther away" from an event can become subsequent event-detecting pods for that same event. If different intermediate pods 130 happen to detect an event sufficiently close in time, they may both end up transmitting sequences of current pulses that interfere with one another. In that case, the transmitted data may be unintelligible, but the terminal pods 140 will still receive an indication that an event was detected.

In addition to or instead of being woken up based on the detection of an event, in some implementations, an intermediate pod 130 may be periodically woken up based on the pod's local clock signal. In that case, the pod may transmit a sequence of current pulses comprising a wake-up pulse followed eventually by a set of data pulses corresponding to the measurement signals generated by the pod's one or more active sensors, for example, to establish normal ambient conditions as a baseline for the detection of events and/or to track gradual changes in ambient conditions over time. Here, too, these pulses will result in the waking up of the other pods and the repetition of the data pulses for ultimate transmission to the terminal pods 140. In some implementations, the periodic awakenings of the different pods are staggered in time in order to prevent pulses initiated by different pods from interfering with one another.

Figure 2:
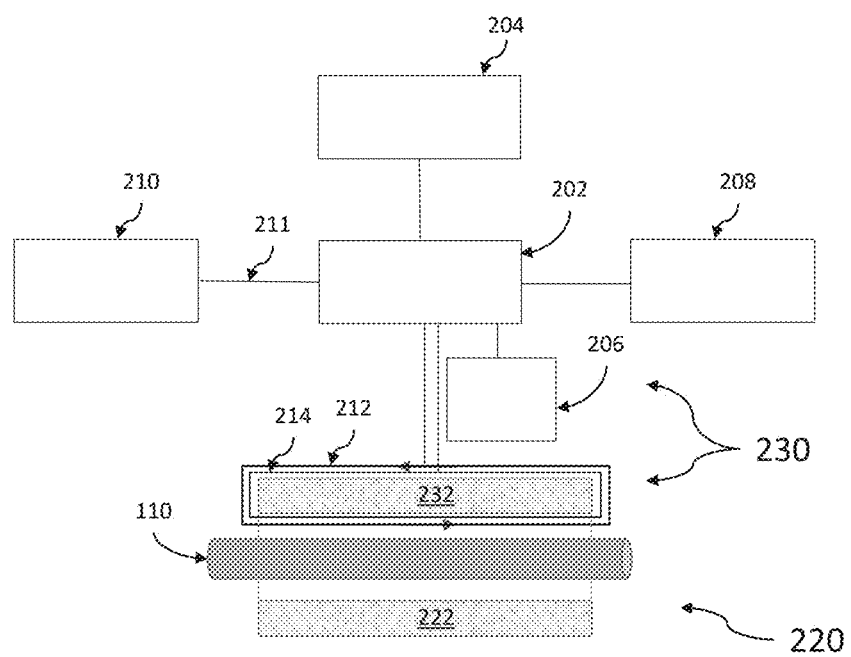
FIG. 2 is an example of a schematic block diagram of a pod that can be used to implement each of the intermediate pods of FIG. 1.

FIG. 2 is a schematic block diagram of an example of a pod 200 that can be used to implement each of the intermediate pods 130 of FIG. 1, according to some implementations. As shown in FIG. 2, the pod 200 includes a controller 202, a battery 204, a clock generator 206, one or more passive detectors 208, one or more active sensors 210, a transmitter (TX) coil 212, a receiver (RX) coil 214, and a magnetic core 222/232. FIG. 2 represents the electrical components 202-210 in block-diagram format, while showing a cross-sectional view of the TX and RX coils 212 and 214 and the magnetic core 222/232.

As explained previously, the pod 200 may be implemented in two shaped portions 220 and 230, each of which has a corresponding part 222 or 232 of the magnetic core 222/232, where the TX and RX coils 212 and 214 surround the magnetic core part 232 of the pod portion 230. Although not explicitly depicted in FIG. 2, also located within the pod portion 230 are the electrical components 202-210. Each pod portion 220 and 230 is individually encapsulated within a suitable (e.g., plastic) material to protect the pod's electrical components from corrosive materials, such as seawater. The inner space of each pod portion 220/230 may be filled with an appropriate dielectric liquid (e.g., oil) in which the electronics bathe. An interface (not shown), such as a flexible membrane or bellows, enables the internal and external pressures to be balanced.

The two pod portions 220 and 230 are joined together around the cable 110 using a suitable clamping mechanism (not shown in FIG. 2) to configure the assembled pod 200 with the cable 110 passing through the resulting (e.g., cylindrical) opening in the pod. Note that, even though the two magnetic core parts 222 and 232 are not galvanically interconnected, they are inductively interconnected to enable a contiguous magnetic field to be formed around the cable 110. Because the magnetic core 222/232 is inductively coupled, but not galvanically connected, to the cable 110, each pod can be configured to the cable without having to modify the structure of the cable itself.

As explained previously, when a detectable event, such as an earthquake, a tsunami, or movement near the cable, occurs, a passive detector 208 causes the controller 202 to (i) transition from its sleep mode to its awake mode and (ii) optionally energize the one or more active sensors 210, which would generate corresponding electrical measurement signals 211. The controller 202 then energizes the TX coil 212 to inductively generate a wake-up pulse and subsequently an optional set of data pulses propagating along the cable 110 in both directions away from the pod. In particular, the electrical energy in the TX coil 212 inductively induces magnetic energy in the magnetic core 222/232, which in turn induces electrical energy (i.e., current) in the cable 110. By selectively varying the energy in the TX coil 212, the controller 202 is able to generate, in the cable 110, the wake-up pulse and the optional set of data pulses identifying the detected event and optionally characterizing the detected event with the associated measurement signals.

Similarly, when the controller 202 is awoken based on the local clock signal, the controller will energize the one or more active sensors 210 and then energize the TX coil 212 to inductively generate a wake-up pulse and subsequently a set of data pulses propagating along the cable 110 that identify and characterize the active sensor measurement signals.

Reciprocally, when a wake-up pulse propagating along the cable 110 arrives at the pod 200, electrical energy is induced in the RX coil 214 via the magnetic core 222/232, which electrical energy causes the controller 202 to transition from its sleep mode to its awake mode. The controller 202 then energizes the TX coil 212 to repeat the wake-up pulse via the magnetic core 222/232. In a similar manner, when the subsequent data pulses arrive at the still-awake pod 200 and energize the RX coil 214, the controller 202 responds to energize the TX coil 212 to repeat those data pulses.

Those skilled in the art will understand that the TX coil 212, the magnetic core 222/232, and the cable 110 function as a first transformer capable of transferring energy from the pod 200 into the cable 110, while the RX coil 214, the magnetic core 222/232, and the cable 110 function as a second transformer capable of transferring energy from the cable 110 to the pod 200, where the operating characteristics of each transformer depend, in part, on the number of turns around the magnetic core part 232 for the corresponding coil 212/214.

In certain implementations, the magnetic core 222/232 is made of a suitable ferromagnetic material, such as a soft steel, with sufficient magnetic permeability (for example, >10000) and sufficient dimensions to allow the transmission of sufficiently strong pulses from the pod to the cable.

In some implementations, the intermediate pods 130 of FIG. 1 function solely as passive event detectors. In those implementations, the one or more active sensors 210 and the clock generator 206 of FIG. 2 are optional. Note that, in those implementations, an event-detecting pod might transmit only the wake-up pulse as the sole indication of detection of an event. In some other implementations, the intermediate pods 130 function solely as ambient-condition monitors. In those implementations, the passive detectors 208 of FIG. 2 are optional. In these alternative implementations, each intermediate pod 130 would still be able to repeat received pulses. In some other implementations, some of the intermediate pods 130 of FIG. 1 function solely as repeaters of pulses received from other pods. In those implementations, the passive detectors 208 and the active sensors 210 of FIG. 2 are optional.

In some embodiments, since the terminal pods 140 do not need to be able to detect events, monitor ambient conditions, or repeat received current pulses, the design of each terminal pod can be a simplified version of the design of the pod 200 of FIG. 2, where the passive detectors 208, the active sensors 210, and the TX coil 212 are optional. In addition, since the terminal pods 140 may be terrestrial and therefore externally powered, the battery 204 is optional. In some embodiments, one or both terminal pods 140 are able to transmit instructions to the intermediate pods 130. In that case, such terminal pods 140 would have a TX coil 212.

Although the disclosure has been described in the context of pods that transmit information using current pulses, in alternative embodiments, the pods could transmit information using any suitable type of electrical signals, such as (without limitation) a low-frequency voltage signal or a current wave.

Although the disclosure has been described in the context of pods having separate TX and RX coils, in alternative embodiments, a pod may have a single coil that can function as either a TX coil or an RX coil.

Although the disclosure has been described in the context of pods located along a submarine power-transmission cable, those skilled in the art will understand that embodiments of the disclosure can also be implemented in the context of other cables that have an electrical conductor spanning the length of the cable, whether or not that electrical conductor is used to carry an independent electrical current, such as (without limitation) a fiber-optic cable having an electrical conductor spanning the length of the cable in addition to one or more optical fibers. Furthermore, in some applications, the cables may be entirely terrestrial instead of partially submarine and configured to, for example, make scientific measurements and/or detect and monitor for terrestrial events.

The disclosure has been described in the context of cable-with-pods assemblies having a single cable 110 with two terminal pods 140, where each terminal pod processes pulses from all of the intermediate pods 130. In some other embodiments, each terminal pod 140 processes pulses from only a subset of the intermediate pods 130. In some other embodiments, cable-with-pods assemblies might have only one terminal pod 140 that processes pulses from all of the intermediate pods 130. In still other embodiments, cable-with-pods assemblies may have a meshed network comprising multiple intersecting cables, with (i) one or more intermediate pods on each network branch and (ii) a terminal pod at the terminal end of each branch that processes pulses from its branch pods.

Various modifications of the described embodiments, as well as other embodiments within the scope of the disclosure, which are apparent to persons skilled in the art to which the disclosure pertains are deemed to lie within the principle and scope of the disclosure, e.g., as expressed in the appended claims.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The functions of the various elements shown in the figures, including any functional blocks labeled as "processors" and/or "controllers," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be appreciated by those of ordinary skill in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

As used herein and in the claims, the term "provide" with respect to an apparatus or with respect to a system, device, or component encompasses designing or fabricating the apparatus, system, device, or component; causing the apparatus, system, device, or component to be designed or fabricated; and/or obtaining the apparatus, system, device, or component by purchase, lease, rental, or other contractual arrangement.

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

What is claimed is:

1. An apparatus comprising a pod, the pod comprising:
a magnetic core configurable around and inductively couplable to a cable having an electrically conductive portion;
one or more coils inductively couplable to the magnetic core; and
a controller connected to the one or more coils, wherein:
the pod is configured to transmit one or more outgoing electrical signals on the conductive portion of the cable by the controller electrically energizing a transmitter coil of the one or more coils such that outgoing magnetic energy is induced in the magnetic core such that the one or more outgoing electrical signals are induced in the conductive portion of the cable; and
the pod is configured to repeat one or more incoming electrical signals on the conductive portion of the cable by the one or more incoming electrical signals inducing incoming magnetic energy in the magnetic core such that incoming electrical energy is induced in a receiver coil of the one or more coils, wherein the controller responds to the incoming electrical energy by electrically energizing the transmitter coil such that outgoing magnetic energy is induced in the magnetic core such that the one or more incoming electrical signals are inductively repeated in the conductive portion of the cable.

2. The apparatus of claim 1, wherein, when the magnetic core is configured around and inductively coupled to the cable, the magnetic core is not galvanically connected to the electrically conductive portion of the cable.

3. The apparatus of claim 1, wherein the transmitter coil and the receiver coil are the same coil.

4. The apparatus of claim 1, wherein:
the pod further comprises one or more passive detectors configured to detect an event; and
the pod is configured to transmit the one or more outgoing electrical signals on the conductive portion of the cable in response to the detection of the event by the one or more passive detectors.

5. The apparatus of claim 4, wherein:
the controller is configured to selectively operate in one of at least a sleep mode and an awake mode; and
the controller is configured to automatically transition from the sleep mode to the awake mode in response to the detection of the event by the one or more passive detectors.

6. The apparatus of claim 4, wherein the pod is configured to transmit a wake-up signal followed, after a specified time delay, by a set of data signals in response to the detection of the event by the one or more passive detectors.

7. The apparatus of claim 1, wherein:
the pod further comprises one or more active sensors configured to generate measurement signals; and
the pod is configured to transmit the one or more outgoing electrical signals on the conductive portion of the cable in response to the generation of the measurement signals by the one or more active sensors.

8. The apparatus of claim 7, wherein:
the pod further comprises a clock generator;
the controller is configured to selectively operate in one of at least a sleep mode and an awake mode; and
the controller is configured to automatically transition from the sleep mode to the awake mode based on a clock signal from the clock generator.

9. The apparatus of claim 7, wherein the pod is configured to transmit a wake-up signal followed, after a specified time delay, by a set of data signals corresponding to the measurement signals generated by the one or more active sensors.

10. The apparatus of claim 1, wherein:
the controller is configured to selectively operate in one of at least a sleep mode and an awake mode; and
the controller is configured to transition from the sleep mode to the awake mode upon arrival at the pod of a wake-up signal in the cable.

11. The apparatus of claim 10, wherein the pod is configured to repeat the wake-up signal.

12. The apparatus of claim 10, wherein, after receiving the wake-up signal, the pod is configured to repeat one or more received data signals in the cable such that each repeated data signal in the cable overlaps in time with the corresponding received data signal in the cable.

13. A system comprising a plurality of apparatuses of claim 1, the cable, and at least one terminal pod located at at least one end of the cable, wherein a plurality of pods are configured around and inductively coupled to the cable at separate intermediate locations along the length of the cable.

14. The system of claim 13, wherein:
a pod coupled at an intermediate location along the length of the cable is configured to transmit a wake-up signal followed, after a specified time delay, by a set of data signals; and
the specified time delay is long enough to ensure that one or more other pods from the plurality of pods are woken up by an instance of the wake-up signal and are able to respectively repeat the set of data signals.

15. The system of claim 14, wherein each pod from the plurality of pods is configured to repeat signals received from at least two pods on at least one side.

16. The system of claim 13, wherein each pod from the plurality of pods is configured to repeat signals received from at least two pods on at least one side.

17. The apparatus of claim 1, wherein:
when the magnetic core is configured around and inductively coupled to the cable, the magnetic core is not galvanically connected to the electrically conductive portion of the cable;
the transmitter coil and the receiver coil are either the same coil or two different coils;
the pod further comprises one or more passive detectors configured to detect an event, wherein the pod is configured to transmit the one or more outgoing electrical signals on the conductive portion of the cable in response to the detection of the event by the one or more passive detectors;
the controller is configured to selectively operate in one of at least a sleep mode and an awake mode, wherein the controller is configured to automatically transition from the sleep mode to the awake mode in response to the detection of the event by the one or more passive detectors;
the pod is configured to transmit a wake-up signal followed, after a specified time delay, by a set of data signals in response to the detection of the event by the one or more passive detectors;
the pod further comprises one or more active sensors configured to generate measurement signals, wherein the pod is configured to transmit the one or more outgoing electrical signals on the conductive portion of the cable in response to the generation of the measurement signals by the one or more active sensors;
the pod further comprises a clock generator, wherein the controller is configured to automatically transition from the sleep mode to the awake mode based on a clock signal from the clock generator;
the pod is configured to transmit a wake-up signal followed, after a specified time delay, by a set of data signals corresponding to the measurement signals generated by the one or more active sensors;
the controller is configured to transition from the sleep mode to the awake mode upon arrival at the pod of a wake-up signal in the cable, wherein (i) the pod is configured to repeat the wake-up signal and (ii) after receiving the wake-up signal, the pod is configured to repeat one or more received data signals in the cable such that each repeated data signal in the cable overlaps in time with the corresponding received data signal in the cable.

* * * * *